United States Patent
Kitagawa et al.

[11] Patent Number: 5,900,651
[45] Date of Patent: * May 4, 1999

[54] HIGH-WITHSTAND-VOLTAGE SEMICONDUCTOR DEVICE

[75] Inventors: Satoshi Kitagawa; Toshihiro Tabuchi; Toshiyuki Kamei; Tatsuya Kamimura, all of Hiratsuka, Japan

[73] Assignee: Komatsu, Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/564,333

[22] PCT Filed: Jun. 1, 1994

[86] PCT No.: PCT/JP94/00884

§ 371 Date: Dec. 1, 1995

§ 102(e) Date: Dec. 1, 1995

[87] PCT Pub. No.: WO94/28586

PCT Pub. Date: Dec. 8, 1994

[30] Foreign Application Priority Data

Jun. 1, 1993 [JP] Japan ................................. 5-130649

[51] Int. Cl.$^6$ ................................................. H01L 29/747

[52] U.S. Cl. ............................................. 257/127; 257/622
[58] Field of Search ................................... 257/355, 622, 257/623, 127, 119

[56] References Cited

U.S. PATENT DOCUMENTS

| | | | |
|---|---|---|---|
| 3,628,107 | 12/1971 | Kennedy | 317/235 |
| 3,972,014 | 7/1976 | Hutson | 257/127 |
| 3,996,601 | 12/1976 | Hutson | 257/127 |
| 4,190,853 | 2/1980 | Hutson | 257/127 |
| 4,755,862 | 7/1988 | Noguier et al. | 257/127 |

FOREIGN PATENT DOCUMENTS 0114669  4/1990  Japan .

*Primary Examiner*—David B. Hardy
*Attorney, Agent, or Firm*—Welsh & Katz, Ltd.

[57] ABSTRACT

A distance from the bottom of a mesa groove to an underlying pn junction exceeds the elongation of a depletion layer from the underlying pn junction that occurs when a voltage nearly equal to a target withstand voltage is applied, and a groove width of a section other than a corner of the mesa groove, that is, the groove width of a straight section, is nearly equal to the distance from the bottom of the mesa groove to the underlying pn junction.

8 Claims, 10 Drawing Sheets

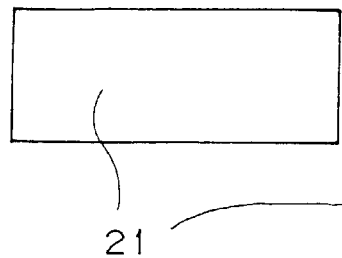 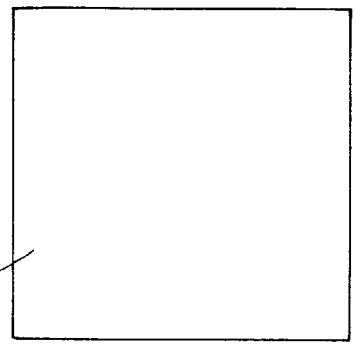
FIG.7(a)  FIG.7(b)
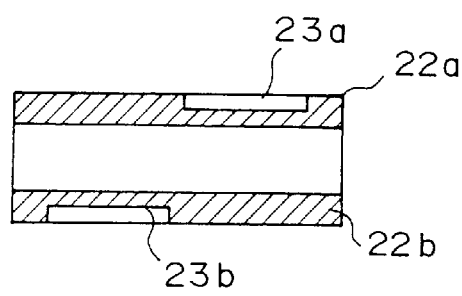 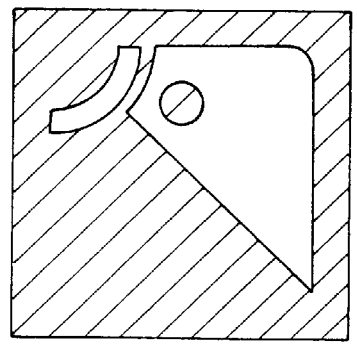
FIG.8(a)  FIG.8(b)
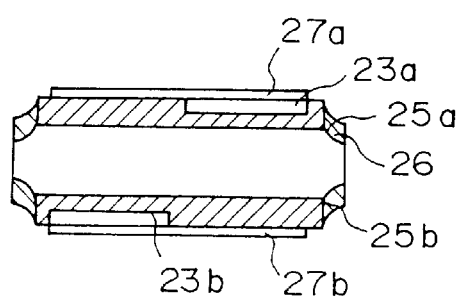 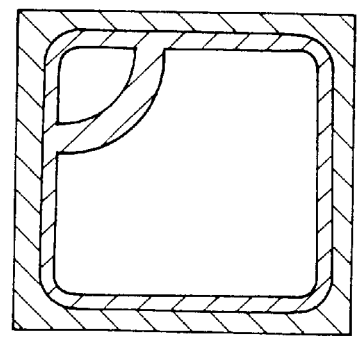
FIG.9(a)  FIG.9(b)

HIGH-WITHSTAND-VOLTAGE SEMICONDUCTOR DEVICE

TECHNICAL FIELD

The present invention relates to a high-withstand-voltage semiconductor device.

BACKGROUND ART

To supply triacs and other high-withstand-voltage semiconductor elements with low prices, a method is adopted in which grooves are formed by so-called mesa etching to terminate pn junctions at the semiconductor surface, and glass is packed as a surface-stabilizing material into these mesa grooves.

For example, in a mesa-type triac having mesa grooves on both sides of the element, as shown in FIG. 11, base layers 2a and 2b made of p-type diffusion layers are formed on the front and back surfaces of an n-type substrate 1, emitter layers 3a and 3b made of n-type diffusion layers are formed in the base layers 2a and 2b, respectively, a mesa groove 4 is formed in such a way that it encircles the outside of this, and glass 5 is filled in the mesa groove.

In addition, there are also semiplanar-type triacs having a mesa groove 4 on only one surface of the element, as shown in FIG. 12.

When a voltage is applied in an OFF state to such triacs, the pn junction between the substrate and the upper or lower base becomes a reverse junction depending on the polarity of the applied voltage, a depletion layer forms its vicinity and the electric current is blocked. To attain a high withstand voltage, therefore, it is necessary to prepare a high-resistance substrate in which the breakdown voltage of the pn junction is equal to or greater than a target withstand voltage. As used herein, the term "high withstand voltage" refers to a withstand voltage of 1200 V or higher.

For example, when the object is to obtain a withstand voltage of 1500 V, then, theoretically, it is sufficient to use a substrate having a resistivity of 30 ωcm, as is evident in FIG. 13, but in practice a substrate having a resistivity of higher than 30 ω must be used because in addition to the substrate resistance, there are crystal defects or impurity contaminants in the substrate, unevenness or roughness in the junction surfaces or mesa groove surfaces, curvature of the mesa groove surfaces, and other factors that lower the withstand voltage.

Thus, the substrate resistance must be made fairly high and the withstand voltage of the reverse junction between the base and the substrate must be raised in order to obtain a semiconductor element having high withstand voltage.

However, an increase in the substrate resistance is accompanied by an increase in the elongation of the depletion layer near the pn junction that occurs when a voltage is applied, as shown in FIG. 14. This is the reason that when a high withstand voltage exceeding a certain limit is applied, the depletion layer projects upward or downward and reaches yet another base layer, or projects outward in the transverse direction, passes under the mesa groove, and reaches the isolation layer (diffusion layer for element separation), and a breakdown occurs due to a punch-through, as shown in FIG. 15. For this reason, there has been a disadvantage that a high withstand voltage above the aforementioned limit cannot be attained merely by raising the substrate resistance.

DISCLOSURE OF THE INVENTION

With the foregoing in view, it is an object of the present invention to provide a high-withstand-voltage semiconductor element.

In view of this, in the present invention, the distance from the bottom of the mesa groove formed on the side of a first pn junction surface to the surface of a second pn junction exceeds the elongation of the depletion layer from the second pn junction that occurs when a voltage of nearly equal to the target withstand voltage is applied. In addition, it is desirable that the groove width of the section other than the corner of the mesa groove, that is, the groove width of the straight section, be nearly equal to the distance from the bottom of the mesa groove to the second pn junction.

Specifically, the present invention is characterized by comprising first and second semiconductor layers of a second conduction type that are formed on the front and back of a semiconductor substrate of a first conduction type; third and fourth semiconductor layers of the first conduction type that are formed in the first and second semiconductor layers; first and second pn junctions formed between the semiconductor substrate and the first and second semiconductor layers, respectively; and a structure in which a grooved section is formed in such a way that it reaches the first pn junction from the uppermost surface of the first semiconductor layer, and the ends of the first pn junction are made visible; and by the fact that a distance d between the second pn junction and the bottom of the grooved section, and a width w of the grooved section are such that, assuming that $V_B$ is the target withstand voltage, a depletion layer region formed starting from the surface of the second pn junction in accordance with an impurity concentration N of the semiconductor substrate does not project beyond the bottom of the grooved section and the width of the grooved section when a voltage equal to the target withstand voltage $V_B$ is applied between the first semiconductor layer and the second semiconductor layer.

Specifically, this means an arrangement in which Formulae (1) and (2) below are satisfied.

$$d > \{(2 \times K_S \times \epsilon_0 \times V_B)/(e \times N)\}^{1/2} \quad (1)$$

$$w > \{(2 \times K_S \times \epsilon_0 \times V_B)/(e \times N)\}^{1/2} \quad (2)$$

where $K_S$ is the relative dielectric constant of the semiconductor substrate, $\epsilon_0$ is the dielectric constant of vacuum ($8.85 \times 10^{-12}$ F/m), and e is the elementary charge.

Moreover, in the present invention, the groove width of a corner section is substantially greater than the groove width of sections other than the corner.

Furthermore, in the case of a structure in which a diffusion layer for element separation is formed around the element, as in a semiplanar-type triac, a groove is formed by etching or other method in the diffusion element separation region prior to diffusion, and the necessary depth for penetration diffusion is reduced.

The present inventors learned the following facts as a result of experiments concerning the breakdown mechanism.

As a result, when a positive voltage is applied to the lower-surface electrode and allowed to rise gradually, the upper pn junction becomes a reverse junction and the depletion layer projects from it downward, as shown in FIG. 15(a). It was learned that when the substrate resistance is fairly high at this time, the depletion layer either reaches the underlying base before the characteristic withstand voltage of the pn junction is reached, or projects outward in the transverse direction, passes under the mesa groove, and reaches the diffusion element separation region, and the faster of these two results in a breakdown due to a punch-through. In this case, therefore, the characteristic withstand voltage of the pn junction can be obtained by substantially increasing the pn junction interval and the mesa groove width.

Conversely, when a positive voltage is applied to the upper-surface electrode and allowed to rise gradually, the lower pn junction becomes a reverse junction and the depletion layer projects from it upward, as shown in FIG. 5(b). In this case, if the substrate resistance is high enough, it will result in a breakdown when the depletion layer reaches the bottom of the mesa groove before the characteristic withstand voltage of the pn junction is reached. This is because when the depletion layer reaches the bottom of the mesa groove, the electric field concentrates within the depletion layer near the bottom of the mesa groove due to the curvature of the bottom surface of the mesa groove and to the fixed charges within the glass packed into the mesa groove. To obtain the characteristic withstand voltage of the pn junction, it is therefore necessary for the distance from the bottom of the mesa groove to the lower pn junction to be substantially greater than the width of this depletion layer.

The results of the two cases illustrated in FIGS. 15(a) and (b) indicate that even for use at an alternating-current voltage, such as in the case of a triac, the characteristic high withstand voltage of the pn junction can be obtained by making the distance from the bottom of the mesa groove to the lower pn junction sufficiently large and substantially increasing the width of the mesa groove, using a high-resistivity substrate.

In addition, because the withstand voltage of the pn junction near the groove surface is considerably lower than the withstand voltage of the pn junction in the bulk when the curvature of the mesa groove surface is substantial, it is necessary to make the mesa groove fairly wide and to reduce the curvature of the groove surface. In particular, the groove surface curvature of a mesa groove corner section, and sometimes the groove width, must be substantial. Therefore, when all the sections of the mesa groove width are shaped in the same manner, as was the case conventionally, the mesa groove occupies a substantial portion of the element surface, the effective surface area of the element decreases, and the ON resistance rises, which is disadvantageous from the standpoint of element characteristics.

In view of this, a second feature of the present invention is that the reduction in the effective surface area of the element can be controlled by forming the groove width of the straight section to a size nearly equal to the distance from the bottom of the mesa groove to the lower pn junction, and forming only the groove width of a corner section to a size substantially greater than this.

In addition, in the case of a structure in which a diffusion layer for element separation is formed around the element, as in a semiplanar-type triac, impurities having an opposite conduction type in relation to that of the substrate are allowed to undergo penetration diffusion from both sides of the substrate, but the substrate thickness is increased, and prolonged, high-temperature diffusion is needed when the distance from the lowermost part of the mesa bottom to the lower pn junction is maintained. For example, a diffusion process of about 350 hours and 1250° C. is needed to allow boron as a p-type impurity to undergo penetration diffusion from both sides into an n-type silicon substrate with a thickness of 300 μm. However, such high-temperature, prolonged diffusion is undesirable because it often produces crystal defects, warping, cracking, and other types of substrate damage.

In view of this, a third feature of the present invention is that the penetration diffusion time and the heat damage to the substrate can be reduced because the substrate thickness of the element separation region can be made fairly small in advance by performing etching prior to the penetration diffusion process.

Thus, the present invention relates to a high-withstand-voltage triac having a semiconductor substrate impurity concentration of $10^{14}$ cm$^{-3}$ or lower, a thickness of 240 μm or greater, and a withstand voltage of 1200 V or higher.

BRIEF DESCRIPTION OF THE DRAWINGS

FIG. 7(a) and FIG. 7(b) are manufacturing process diagrams of the triac of the second embodiment of the present invention;

FIG. 8(a) and FIG. 8(b) are manufacturing process diagrams of the triac of the second embodiment of the present invention;

FIG. 9(a) and FIG. 9(b) are manufacturing process diagrams of the triac of the second embodiment of the present invention;

BEST MODE FOR CARRYING OUT THE INVENTION

The embodiments of the present invention will now be described with reference to drawings.

[Embodiment 1]

Figure 1:
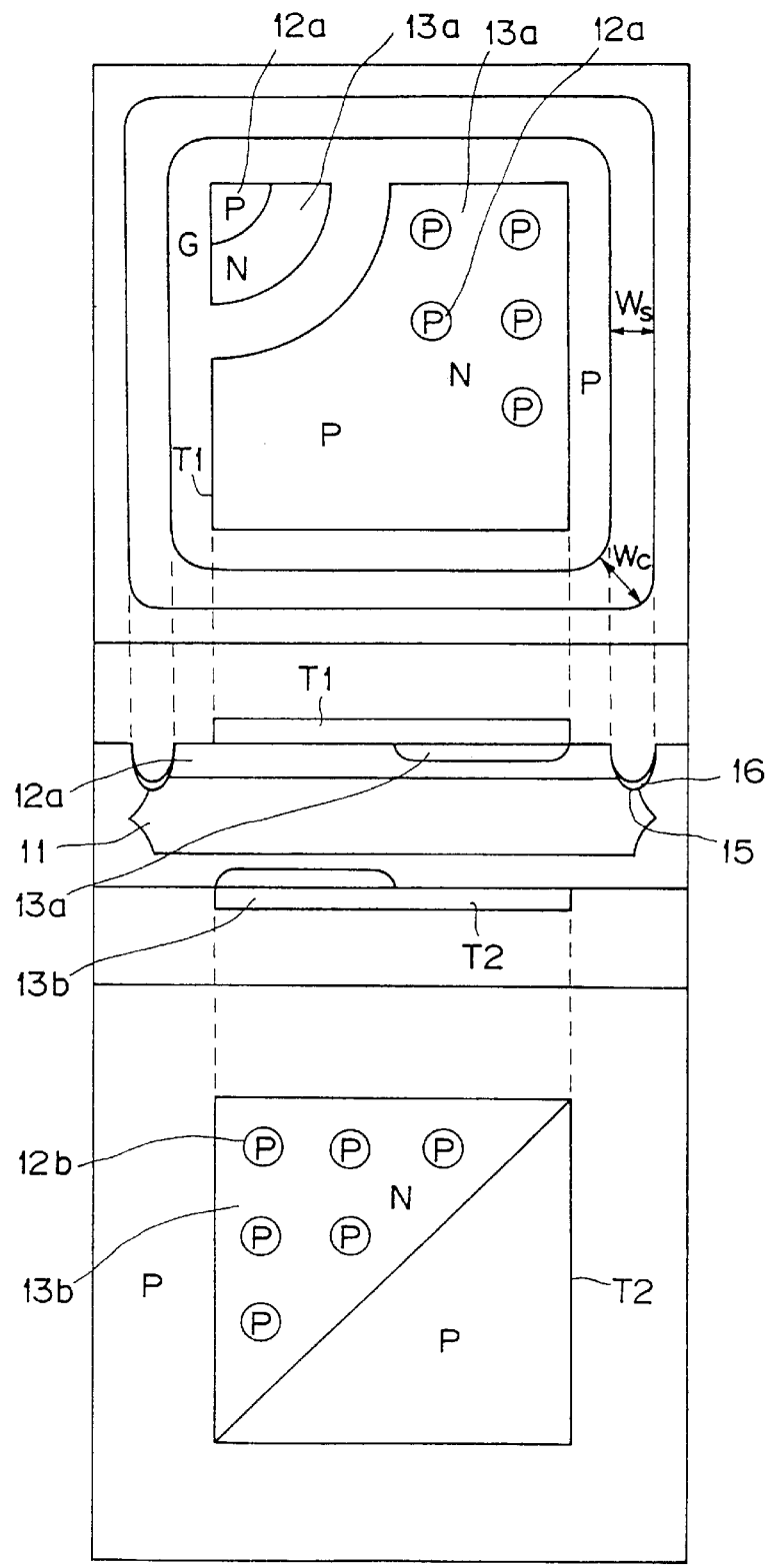
FIG. 1 is a diagram depicting a triac of the first embodiment of the present invention.
Figure 2A:
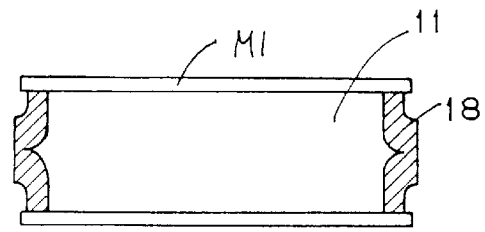
FIG. 2(a) and FIG. 2(b) are manufacturing process diagrams of the triac of the first embodiment of the present invention.
Figure 4A:
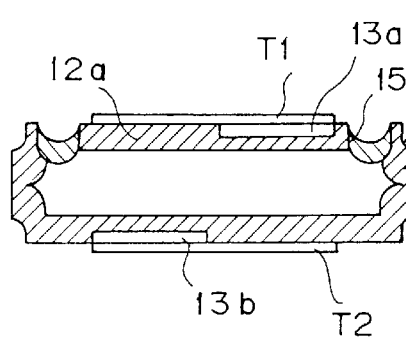
FIG. 4(a) and FIG. 4(b) are manufacturing process diagrams of the triac of the first embodiment of the present invention.

A semiplanar-type triac having a withstand voltage of 1500 V is depicted as a first embodiment of the present invention in FIG. 1, and manufacturing process diagrams are depicted in FIGS. 2(a) and (b) through FIGS. 4(a) and (b). In this triac, which has a chip size of 7 mm square (effective area of the element is 6.2 mm square), base layers 12a and 12b made of p-type diffusion layers with a thickness of 35 μm are formed on the front and back of an n-type silicon substrate 11 with a thickness of 300 μm and a resistivity of 600 ωm, emitter layers 13a and b made of n-type diffusion layers are further formed in these base layers 12a and 12b, a mesa groove 15 with a depth of 85 μm is provided along the chip periphery section, this mesa groove 15 is packed with a glass layer 16, a groove 17 with a depth of 50 μm is further formed on the outside, and a p-type diffusion layer 18 for separating the element from this groove 17 is formed, penetrating the substrate. Here, the distance from the lowermost part of the mesa bottom to the lower pn junction is 180 μm. In addition, the groove width $W_S$ of the mesa groove in the straight section is 200 μm, and the groove width $W_c$ of a corner section is 300 μm.

Figure 2B:
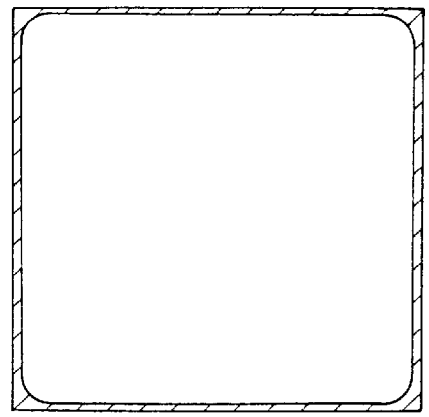

During manufacture, an n-type silicon substrate 11 with a chip size of 7 mm square, a resistivity of 60 ωcm, and a thickness of 300 μm is first prepared, a mask M1 made of a silicon oxide film is formed by common photolithography or etching, the thickness of the chip periphery sections is reduced to 200 μm by etching, boron is caused to undergo penetration diffusion on both sides while the mask is retained in the same state, and a p-type diffusion layer 18 is formed (FIG. 2(a) and FIG. 2(b)). At this time, a mixed solution of hydrofluoric acid, nitric acid, and acetic acid is used as the etching solution. During penetration diffusion, a layer containing a high concentration of boron is formed on the surface of the substrate, and a heat treatment is then performed for 150 hours at 1250° C. to diffuse the boron atoms.

Figure 3A:
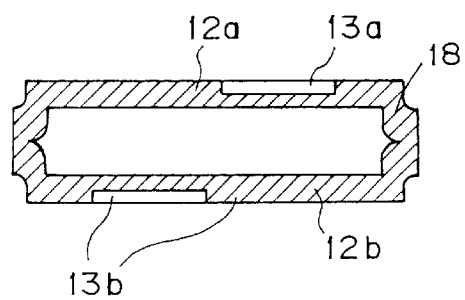
FIG. 3(a) and FIG. 3(b) are manufacturing process diagrams of the triac of the first embodiment of the present invention.
Figure 3B:
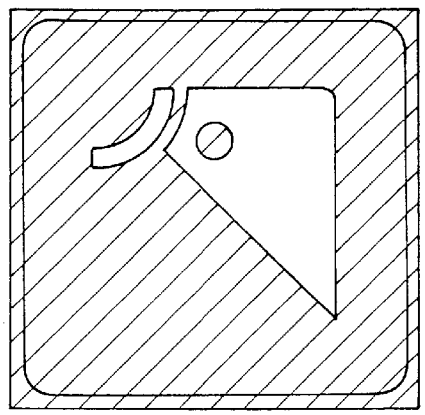

The mask M1 is then removed, boron is allowed to diffuse throughout the entire surface to form a base layer 12 made of a p-type diffusion layer with a thickness of 35 μm, a mask made of a silicon oxide film is then formed, and phosphorus is allowed to selectively diffuse into the base layer 12, yielding an n-type emitter layer 13 (FIG. 3(a) and FIG. 3(b)).

Figure 4B:
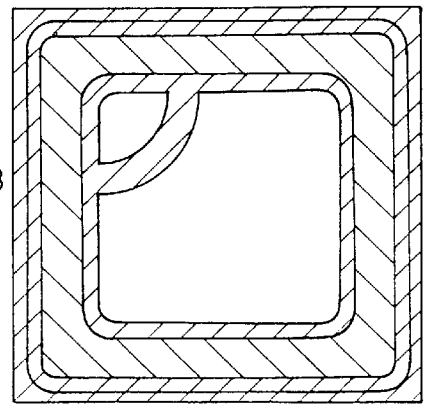

A mask made of a silicon oxide film is then formed, a mesa groove 15 with a depth of 85 μm is formed by etching along the chip periphery on the upper surface, and a glass layer serving as a surface stabilizing material is applied and formed inside the groove. Metal films are then vapor-deposited on both sides, electrodes $T_1$ and $T_2$ (front surface electrode $T_1$, back surface electrode $T_2$) are formed by common photolithography or etching, and the wafer is finally diced using the area around the groove 17 as the border, completing the triac chip (FIG. 4(a) and FIG. 4(b)).

In the triac thus formed, the distance from the mesa groove bottom to the lower pn junction is 180 μm, and a withstand voltage of 1500 V can be adequately obtained. In addition, because the groove width of the straight section of the mesa groove is smaller than the corner section, the effective surface area of the element is increased by about 7% in comparison with a case in which all the groove widths are 300 μm and the ON voltage is reduced by about 7%. The distance between the upper pn junction and the lower pn junction is 230 μm. Despite this, the effective surface area of the element is 38 mm², and an ON voltage of 1.3 V or lower can be adequately obtained.

Figure 5:
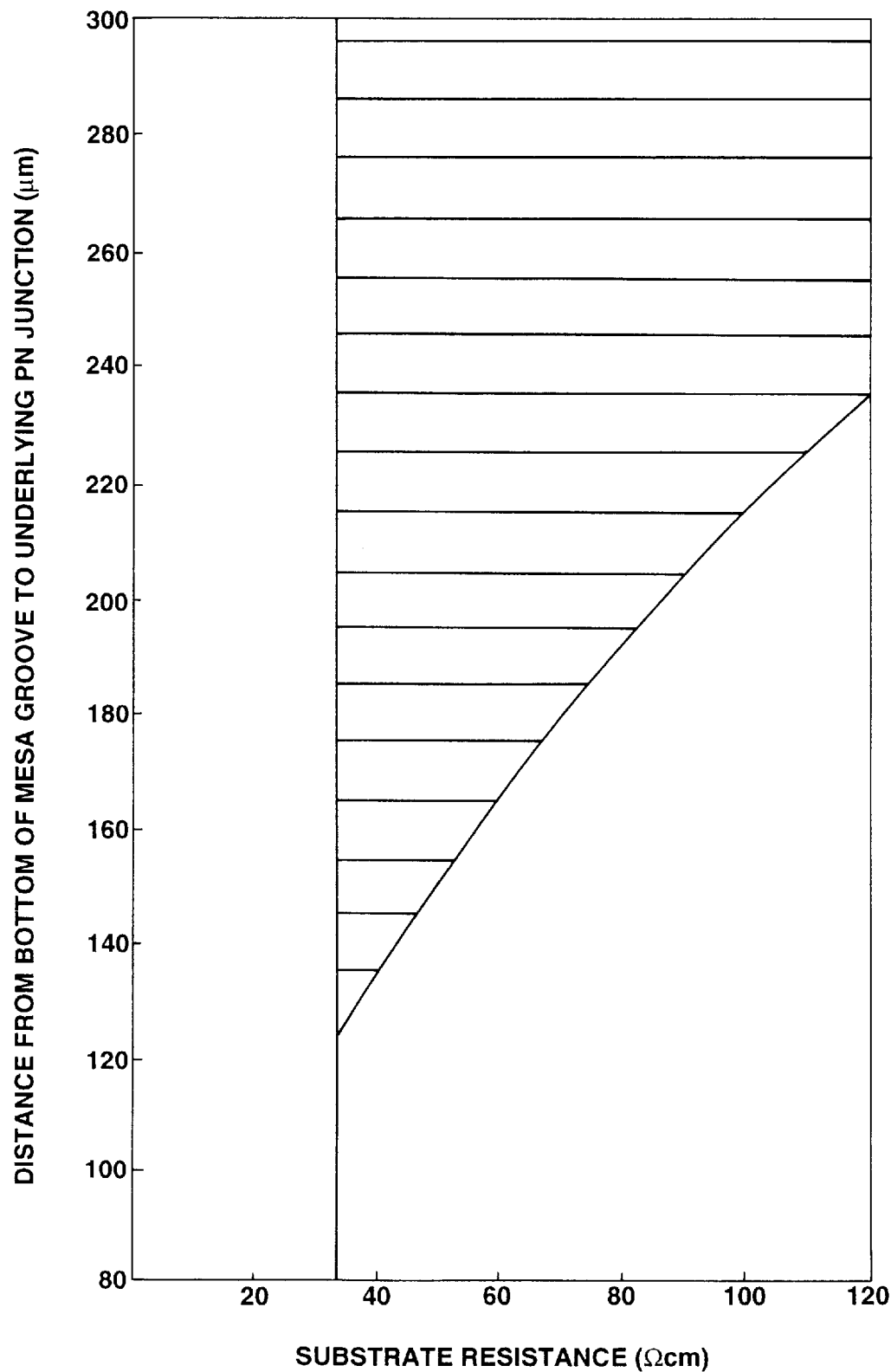
FIG. 5 is a diagram depicting the relation between the substrate resistance and the distance from the bottom of the mesa groove to the surface of the pn junction for obtaining a withstand voltage of 1500 V.
Figure 13:
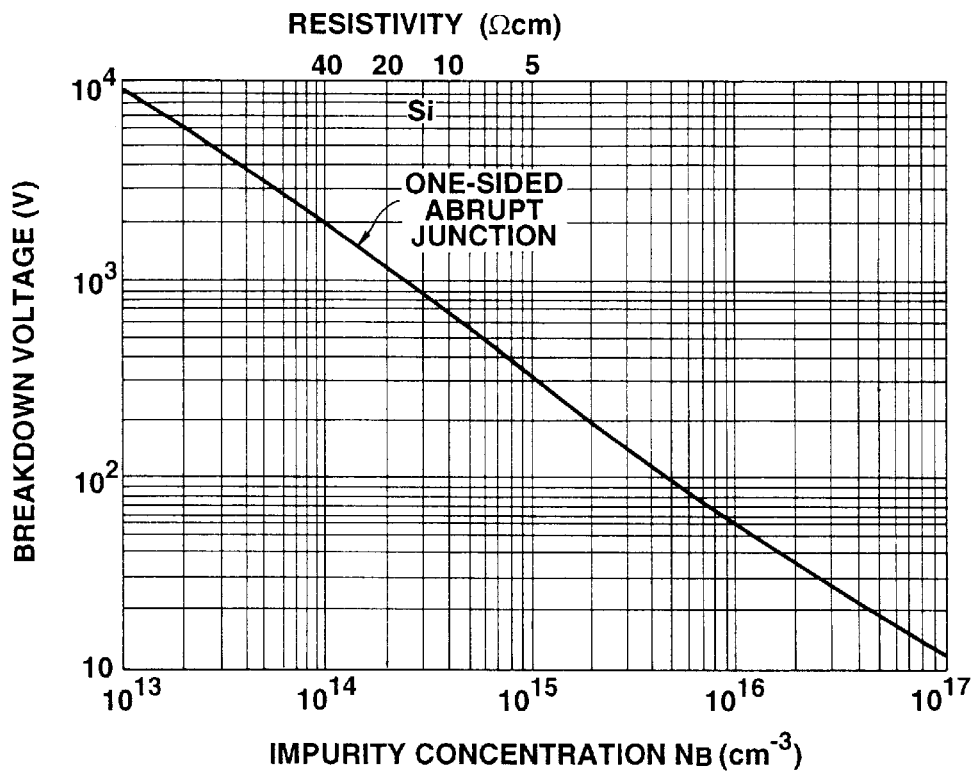
FIG. 13 is a diagram depicting the relation between the substrate concentration and the reverse withstand voltage of a pn junction.
Figure 14:
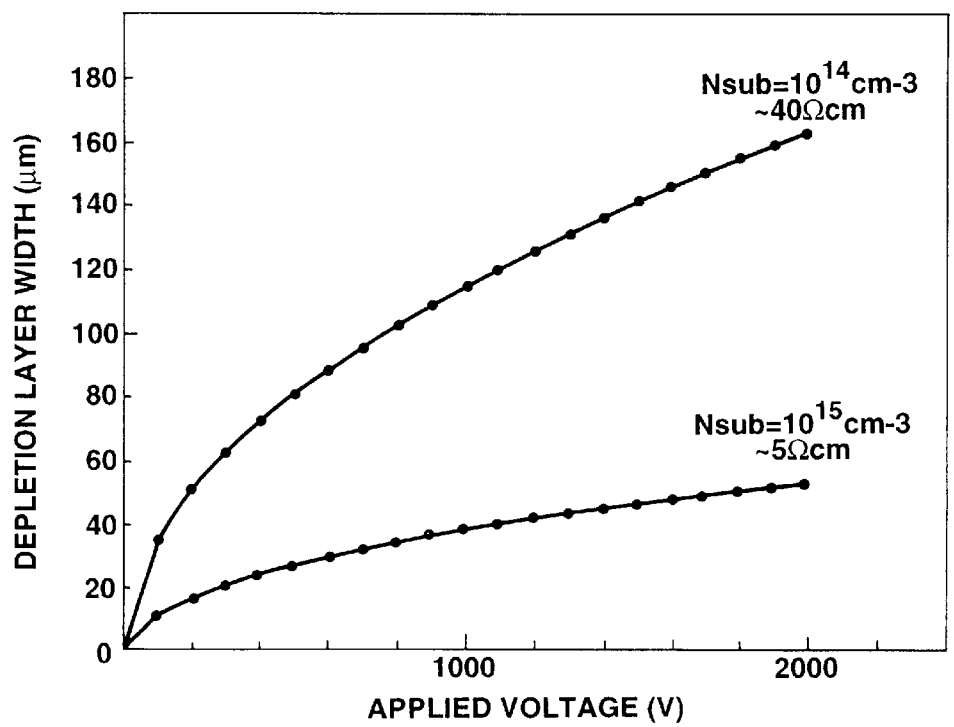
FIG. 14 is a diagram depicting the applied voltage dependence of the depletion layer width.
Figure 15A:
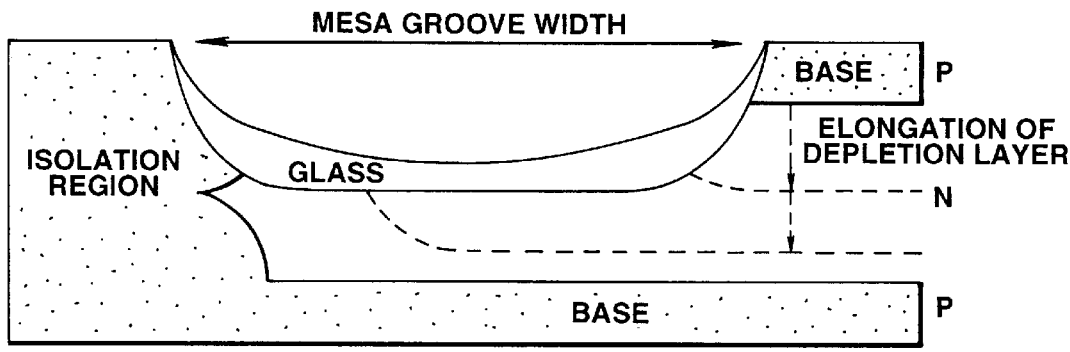
FIG. 15(a) and 15(b) are diagrams depicting the elongation of the depletion layer during voltage application.
Figure 15B:
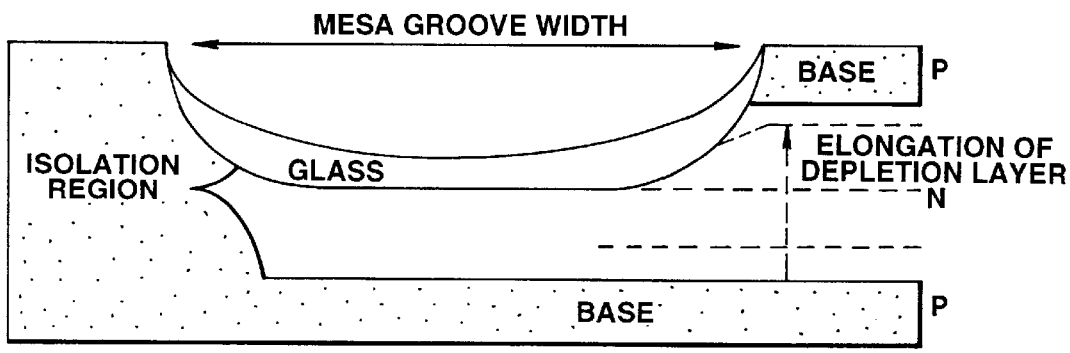

FIG. 5 shows a summary of our experimental results concerning the relation between the substrate resistance and the distance from the mesa groove bottom to the lower pn junction for attaining a withstand voltage of 1500 V or higher. The lower limit of the impurity concentration N of the substrate is determined based on the relation between the impurity concentration and the withstand voltage in FIG. 13, and the range of distances d between the mesa groove bottom and the second pn junction is determined based on the depletion layer width resulting from the application of 1500 V. These results also demonstrate that a withstand voltage of 1500 V or higher can be obtained when the resistivity is 60 ωcm and the distance from the lowermost part of the mesa bottom to the lower pn junction is 180 μm.

Figure 6:
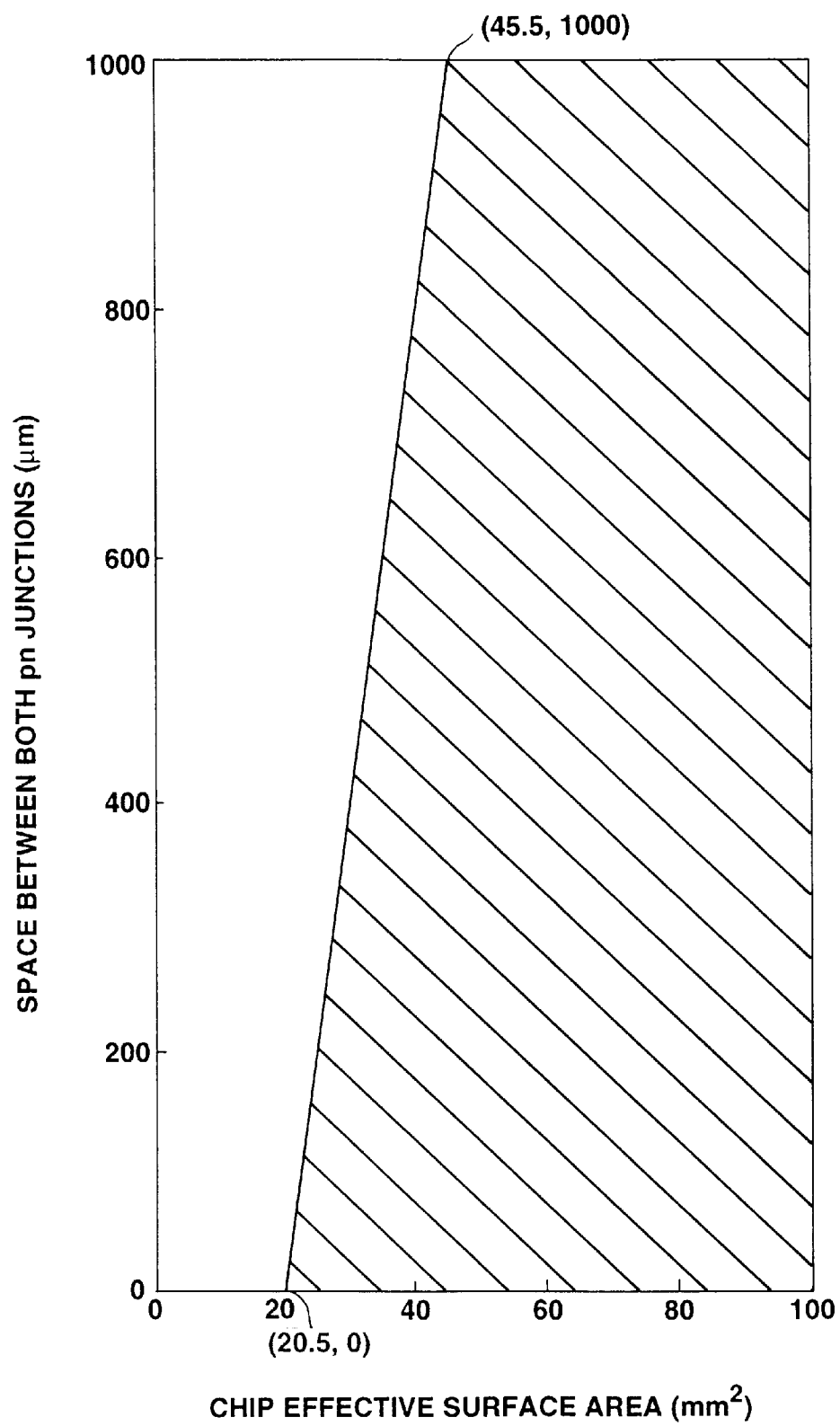
FIG. 6 is a diagram depicting the relation of distance between the chip effective surface area and the junction surfaces for obtaining an ON voltage of 1.3 V.

FIG. 6 shows the results of measuring the relation between the pn junction interval and the chip effective surface area designed to attain an ON voltage of 1.3 V or lower at an ON current of 40 A. These results also demonstrate that an ON voltage of 1.3 V or lower can be adequately obtained with the triac of the present invention, for which the distance between the upper pn junction and the lower pn junction is 230 μm, and the effective surface area of the element is 38 mm².

[Embodiment 2]

The manufacturing process diagrams of a mesa-type triac having a withstand voltage of 2000 V are depicted as a second embodiment of the present invention in FIG. 7(a) and FIG. 7(b) through FIG. 9(a) and FIG. 9(b). This triac, which has a chip size of 6.4 mm square, is obtained by forming a base layer 22 made of a p-type diffusion layer with a depth of 35 μm in an n-type silicon substrate 21 with a resistivity of 70 ωcm and a thickness of 340 μm, providing mesa grooves 25a and b with a depth of 85 μm along the chip periphery section, and coating the inside of these mesa grooves 25 with a glass layer 26.

In this case, the distance from the lowermost part of the mesa bottom to the lower pn junction is 240 μm. In addition, the groove width of the mesa groove is 200 μm in the straight section, and 300 μm in the corner section.

During manufacture, an n-type silicon substrate 21 with a chip size of 6.4 mm square, a resistivity of 70 ωcm, and a thickness of 340 μm is first prepared (FIG. 7(a) and FIG. 7(b).

Boron is subsequently caused to diffuse throughout the entire upper and lower surface to form base layers 22a and b made of p-type diffusion layers with a thickness of 35 μm, a mask made of a silicon oxide film is then formed, phosphorus is allowed to selectively diffuse in the base layers 22a and b, and n-type emitter layers 23a and b are formed (FIG. 8(a) and FIG. 8(b)).

A mask made of a silicon oxide film is then formed, mesa grooves 25a and b with a depth of 85 μm are formed by etching along the chip periphery on the upper and lower surfaces, and a glass layer 26 serving as a surface stabilizing material is applied and formed inside the groove. Metal films are then vapor-deposited on both sides, electrodes 27a and b are formed by common photolithography or etching, and the wafer is finally diced, completing the triac chip (FIG. 9(a) and FIG. 9(b)).

In the triac thus formed, the distance from the mesa groove bottom to the lower pn junction is 240 μm, and a withstand voltage of 2000 V can be adequately obtained. In addition, the distance between the upper pn junction and the lower pn junction is 270 μm. Despite this, the effective surface area of the element is 43 mm², and an ON voltage of 1.3 V or lower can be adequately obtained.

Figure 10:
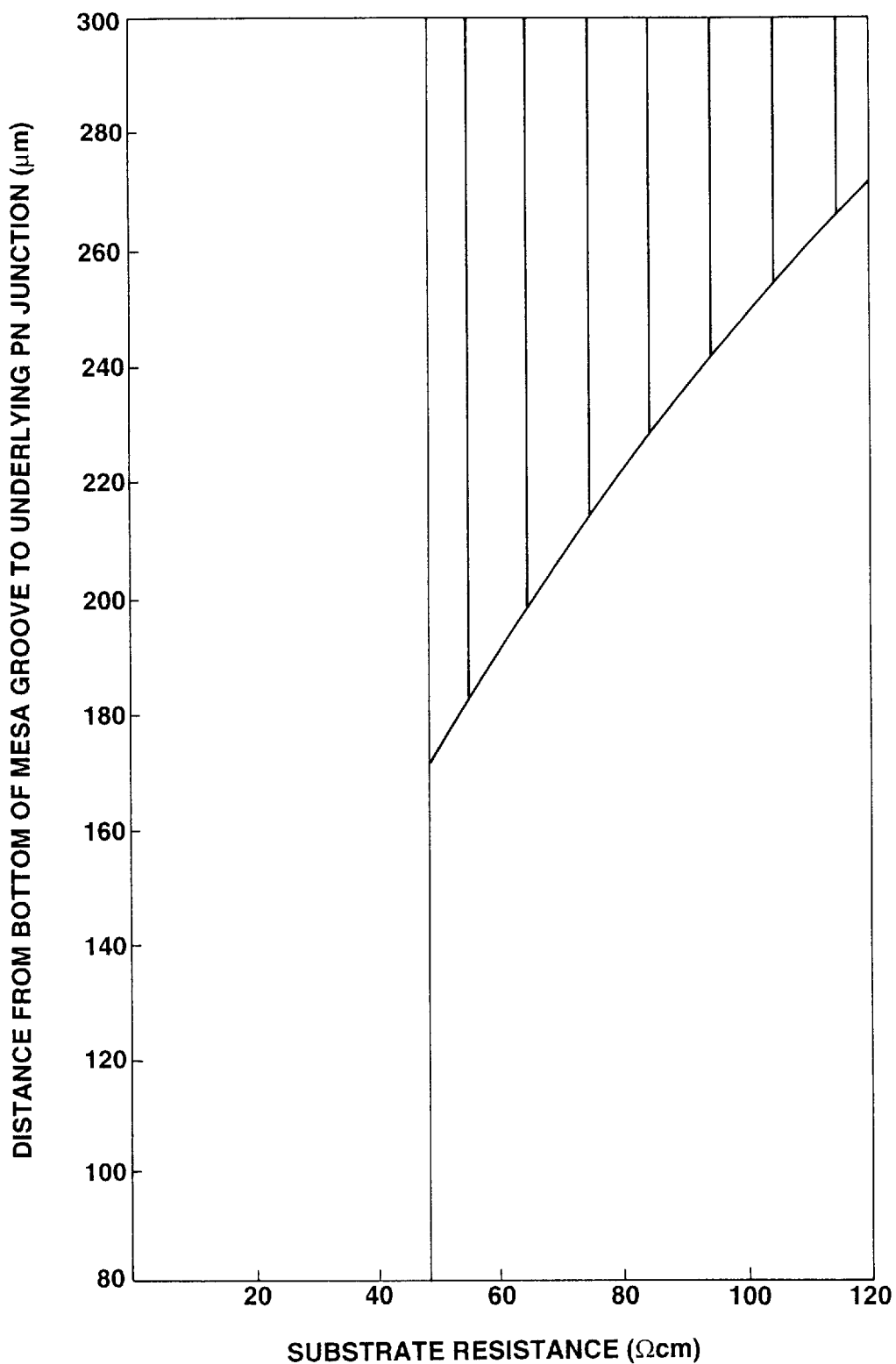
FIG. 10 is a diagram depicting the relation between the substrate resistance and the distance from the bottom of the mesa groove to the surface of the pn junction for obtaining a withstand voltage of 2000 V.
Figure 11:
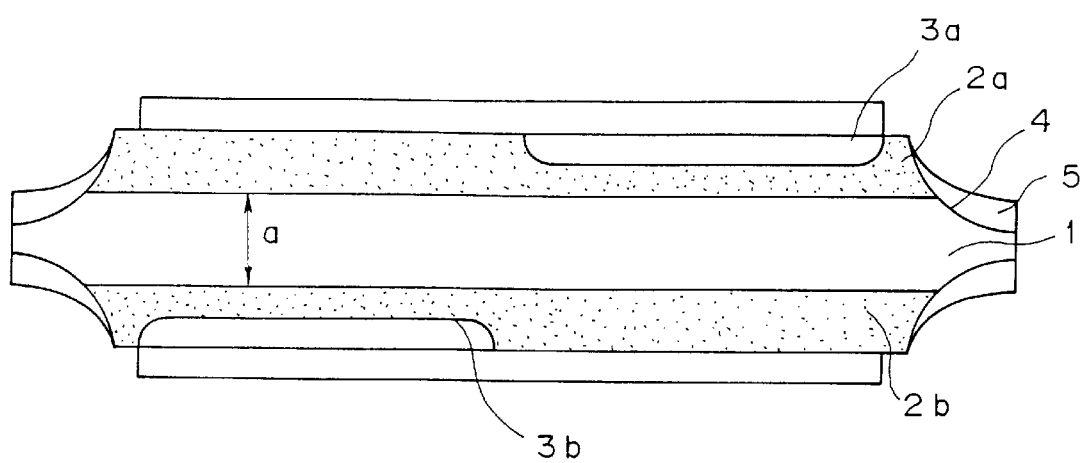
FIG. 11 is a diagram depicting a conventional triac.
Figure 12A:
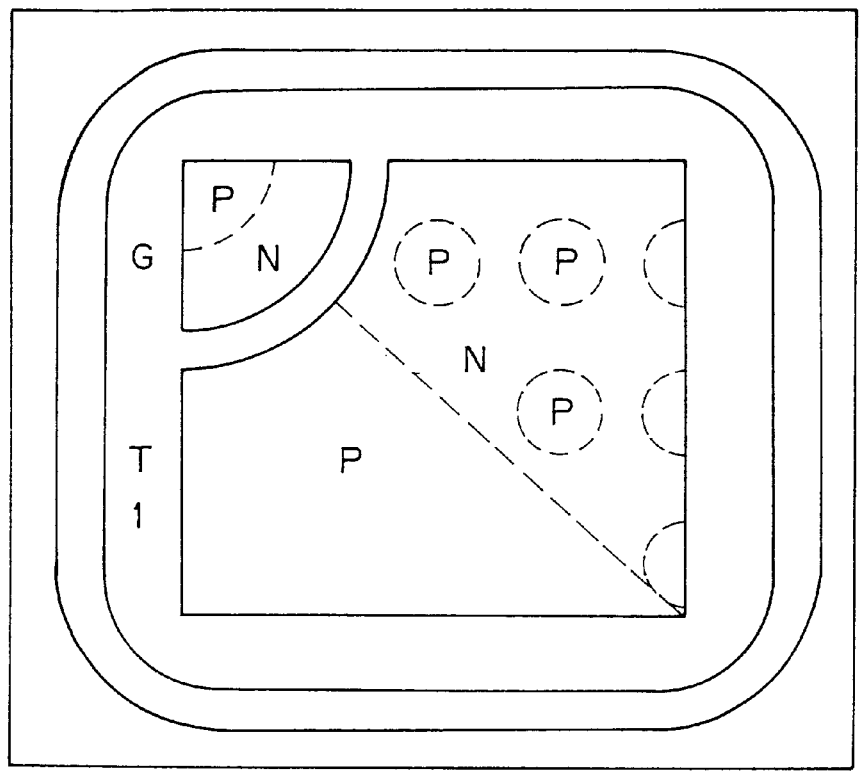
FIG. 12(a) and FIG. 12(b) are diagrams depicting conventional triacs.
Figure 12B:
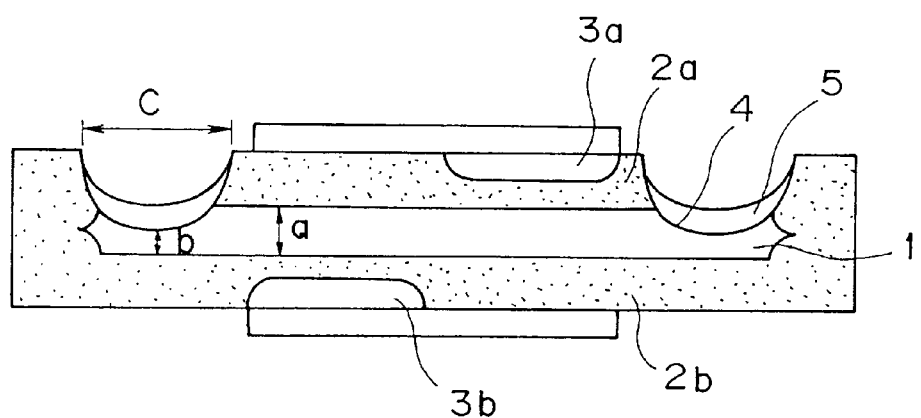

FIG. 10 shows a summary of our experimental results concerning the relation between the substrate resistance and the distance from the mesa groove bottom to the lower pn junction for attaining a withstand voltage of 2000 V or higher. The lower limit of the impurity concentration N of the substrate is determined based on the relation between the impurity concentration and the withstand voltage in FIG. 13, and the range of distances d between the mesa groove bottom and the second pn junction is determined based on the depletion layer width resulting from the application of 2000 V. These results also demonstrate that a withstand voltage of 2000 V or higher can be obtained when the resistivity is 70 ωcm and the distance from the lowermost part of the mesa bottom to the lower pn junction is 240 μm.

FIG. 6, which shows the results of measuring the relation between the pn junction interval and the chip effective surface area designed to attain a voltage of 1.3 V or lower, also demonstrates that an ON voltage of 1.3 V or lower can be adequately obtained with the triac of the present invention, for which the distance between the upper pn junction and the lower pn junction is 270 μm, and the effective surface area of the element 43 mm².

INDUSTRIAL APPLICABILITY

As described above, the present invention can yield a triac having a high withstand voltage and a sufficiently low ON resistance.

In addition, the reduction in the effective surface area of the element can be controlled by increasing the groove width of the corner section greater over that of other regions.

We claim:

1. A high-withstand-voltage semiconductor device including first and second semiconductor layers of a second conduction type that are formed on directly adjacent and contacting the front and back surfaces of a semiconductor substrate of a first conduction type; third and fourth semiconductor layers of the first conduction type that are formed in the first and second semiconductor layers; and first and second pn junctions formed between the semiconductor substrate and the first and second semiconductor layers, respectively and achieving a target withstand voltage with respect to a voltage applied between the first and second semiconductor layers, characterized in that the semiconductor device comprises:

a grooved section contacting an end of the first pn junction at an uppermost surface of the first semiconductor layer, and an element separation region of the second conduction type, penetrating the semiconductor substrate in a vertical direction and formed on an outer periphery of the grooved section, having a distance between the second pn junction and a bottom of the grooved section said distance being longer than a distance of a depletion layer section formed by the second pn junction and extending in a vertical direction, when a voltage equal to the target withstand voltage is applied between the first semiconductor layer and the second semiconductor layer, and a width of a grooved section is longer than a distance of a depletion layer region formed by the first pn junction and extending in a horizontal direction, when the voltage equal to the target withstanding voltage is applied between the first semiconductor layer and the second semiconductor layer.

2. A height-withstand-voltage semiconductor device as defined in claim 1, characterized in that the distance d between the bottom of the grooved section and the second pn junction, and the width w of the grooved section satisfy the following formulae $$d > \{(2 \times K_S \times \epsilon_0 \times V_B)/(e \times N)\}^{1/2} \quad (1)$$

$$w > \{(2 \times K_S \times \epsilon_0 \times V_B)/(e \times N)\}^{1/2} \quad (2)$$

where $K_S$ is a relative dielectric constant of the semiconductor substrate, $\epsilon_0$ is a dielectric constant of vacuum ($8.85 \times 10^{-12}$ F/m), $V_B$ is the target withstand voltage, e is an elementary charge, and N is an impurity concentration of the semiconductor substrate.

3. A high-withstand-voltage semiconductor device as defined in claim 1, characterized in that the semiconductor substrate is a silicon substrate.

4. A high-withstand-voltage semiconductor device as defined in claim 1, characterized in that the grooved section is formed in such a way that a width of a curved section is greater than a width of a straight section.

5. A high-withstand-voltage semiconductor device as defined in claim 1, characterized in that the grooved section comprises an element separation region made of a penetrating diffusion layer encircling an outside of the grooved section.

6. A high-withstand-voltage semiconductor device as defined in claim 1, characterized in that the semiconductor device is a semiplanar-type triac.

7. A high-withstand-voltage semiconductor device as defined in claim 1, characterized in that the semiconductor substrate has an impurity concentration of $10^{14}$ cm$^{-3}$ or lower and a thickness of 240 μm or greater.

8. A high-withstand-voltage semiconductor device as defined in claim 1, characterized in that the semiconductor substrate is a high-withstand-voltage semiplanar-type triac with a withstand voltage of 1200 V or higher.

* * * * *